United States Patent
Kovacs

(10) Patent No.: US 10,469,022 B2
(45) Date of Patent: Nov. 5, 2019

(54) PHOTO-VOLTAIC PANEL RETENTION APPARATUS, SYSTEM AND METHOD

(71) Applicant: PMC Industries, Inc., Plainville, CT (US)

(72) Inventor: Tamas Kovacs, Burlington, CT (US)

(73) Assignee: PMC Industries, Inc., Plainville, CT (US)

( * ) Notice: Subject to any disclaimer, the term of this patent is extended or adjusted under 35 U.S.C. 154(b) by 0 days.

(21) Appl. No.: 15/911,167

(22) Filed: Mar. 4, 2018

(65) Prior Publication Data

US 2019/0273460 A1    Sep. 5, 2019

(51) Int. Cl.
| | |
|---|---|
| *H02S 20/10* | (2014.01) |
| *H02S 20/23* | (2014.01) |
| *E04D 3/30* | (2006.01) |
| *H01L 31/042* | (2014.01) |

(52) U.S. Cl.
CPC .............. *H02S 20/23* (2014.12); *H02S 20/10* (2014.12); *E04D 3/30* (2013.01); *H01L 31/042* (2013.01); *Y02B 10/12* (2013.01)

(58) Field of Classification Search
CPC ............... H01L 31/048; H01L 31/0482; H01L 31/0483; H01L 31/0484; Y02B 10/12; Y02B 10/47; F24J 2/5245; F24J 2/5258; F16L 3/06
See application file for complete search history.

(56) References Cited

U.S. PATENT DOCUMENTS

| | | | | |
|---|---|---|---|---|
| 7,634,875 B2 * | 12/2009 | Genschorek | ............ | H02S 20/23 52/173.3 |
| 8,387,319 B1 * | 3/2013 | Gilles-Gagnon | ..... | F24S 25/615 52/173.3 |
| 8,505,864 B1 * | 8/2013 | Taylor | ................... | F24S 25/636 248/237 |
| 8,640,401 B2 * | 2/2014 | Hong | ...................... | H02S 20/23 52/173.3 |
| 8,935,893 B2 * | 1/2015 | Liu | .......................... | F16L 3/06 52/173.3 |
| 8,938,932 B1 * | 1/2015 | Wentworth | ............. | H02S 20/23 52/747.1 |
| 8,984,818 B2 * | 3/2015 | McPheeters | ............ | H02S 20/00 52/173.3 |

(Continued)

*Primary Examiner* — Phi D A
(74) *Attorney, Agent, or Firm* — Damian Wasserbauer, Esq.; Wasserbauer Law LLC

(57) ABSTRACT

The invention relates to retention systems and, more particularly, for a modular retention apparatus, system and method for securing and leveling a photovoltaic (PV) panel and other objects on a wall, rooftop and other structure to secure and ground electrically. The photovoltaic panel retention assembly utilizes a solar cap with one or more integral elongated flange extensions of a predetermined dimension to provide spacing between PV solar panels and/or to stabilize the solar cap from tipping under installation forces and load in use. The flanges extend through a support bracket configured with a base portion to support adjacent PV panels in a PV panel array and a base platform portion. The solar cap comprises integral teeth on a surface of the solar cap spaced apart from the flanged projections to locate the teeth adjacent a frame of the PV panel for electrical grounding thereof.

6 Claims, 4 Drawing Sheets

(56) References Cited

U.S. PATENT DOCUMENTS

| | | | |
|---|---|---|---|
| 2011/0138585 A1* | 6/2011 | Kmita | H02S 20/00 24/522 |
| 2012/0031019 A1* | 2/2012 | Stearns | E04D 13/10 52/173.3 |
| 2013/0011187 A1* | 1/2013 | Schuit | F16B 2/065 403/287 |
| 2015/0171785 A1* | 6/2015 | Dickey | H02S 20/24 248/346.03 |
| 2016/0126884 A1* | 5/2016 | Stearns | H02S 20/23 52/173.3 |
| 2016/0308486 A1* | 10/2016 | Atia | H02S 20/23 |

* cited by examiner

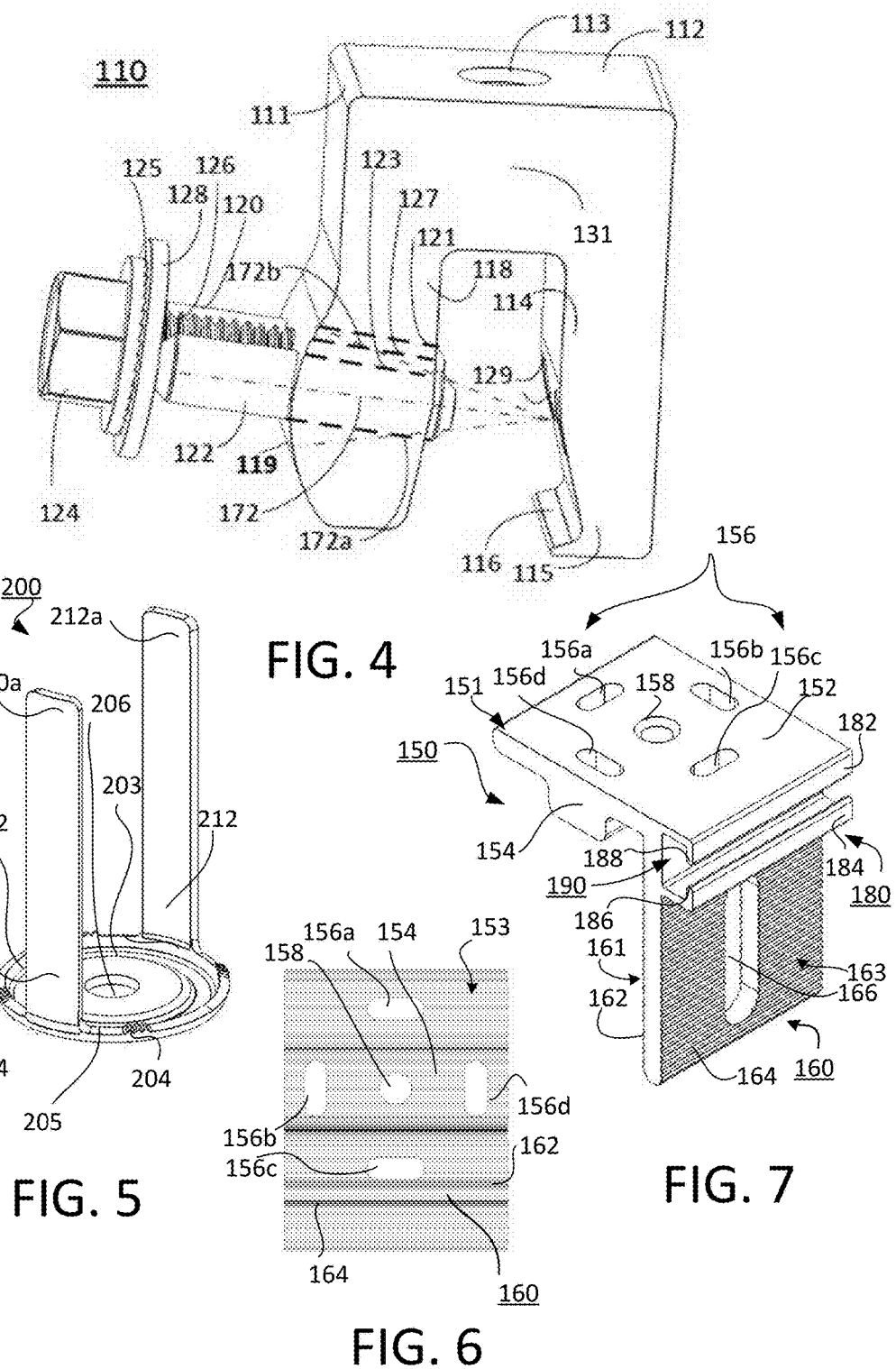

PHOTO-VOLTAIC PANEL RETENTION APPARATUS, SYSTEM AND METHOD

FIELD OF THE INVENTION

The present invention relates to retention systems and, more particularly, for a modular retention apparatus, system and method for securing and leveling a photovoltaic (PV) panel and other objects on a wall, rooftop and other structure to secure and ground electrically.

BACKGROUND OF THE INVENTION

Conventional assemblies and methods for mounting a photovoltaic (PV) panel and other objects on a wall, rooftop and other structure generally involve numerous parts that increase the cost of manufacturing the assembly and its price. This applies to conventional assemblies designed for a roof structure, e.g. a metal roof with a standing seam. Similarly these conventional standing seam assemblies and systems require numerous parts and assemblies that add cost to the manufacture and installation. Consequently, conventional assemblies are costly to manufacture as well as installation time is increased because of the assembly required on-site that adds time on the roof for the installer and overall costs for the installation.

Consequently, there is a long felt need for a simple and effective means to secure, ground and level photo-voltaic panels to a support on a building structure and/or roof to prevent damage to the panel and electrical shock to a person.

SUMMARY OF THE INVENTION

It is an object of the present invention to provide a photovoltaic panel retention system and method that utilizes a solar cap with one or more integral elongated flange extensions of a predetermined dimension (1) to provide spacing between PV solar panels, (2) to stabilize the solar cap from tipping under installation forces and load in use.

It is an object of the present invention to provide a photovoltaic panel retention system and method that utilizes a solar cap with integral teeth on a surface of the solar cap adjacent the PV panel for electrical grounding thereof.

It is an object of the present invention to provide a photovoltaic panel retention system and method that utilizes a support bracket of a general L-shape configured with a base portion to support adjacent PV panels in a PV panel array using a base platform portion. It is an object of the present invention to eliminate the need for expensive racking frames and systems, time and the component part and installation expense, whereby the PV panel retention apparatus system can use a rail and/or posted-base support systems.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Description of the Embodiments, which is to be read in association with the accompanying drawings, which are incorporated in and constitute a part of this specification, show certain aspects of the subject matter disclosed herein and, together with the description, help explain some of the principles associated with the disclosed implementations, wherein:

FIG. 4 is a schematic side view illustrating the mounting clamp of the present invention;

FIG. 5 is a perspective view illustrating the solar cap with flanged portions and grounding protrusions of the present invention;

FIG. 6 is a top view illustrating the support bracket of the present invention; and FIG. 7 is a perspective view illustrating the support bracket of the present invention.

DESCRIPTION OF THE EMBODIMENTS

Figure 1:
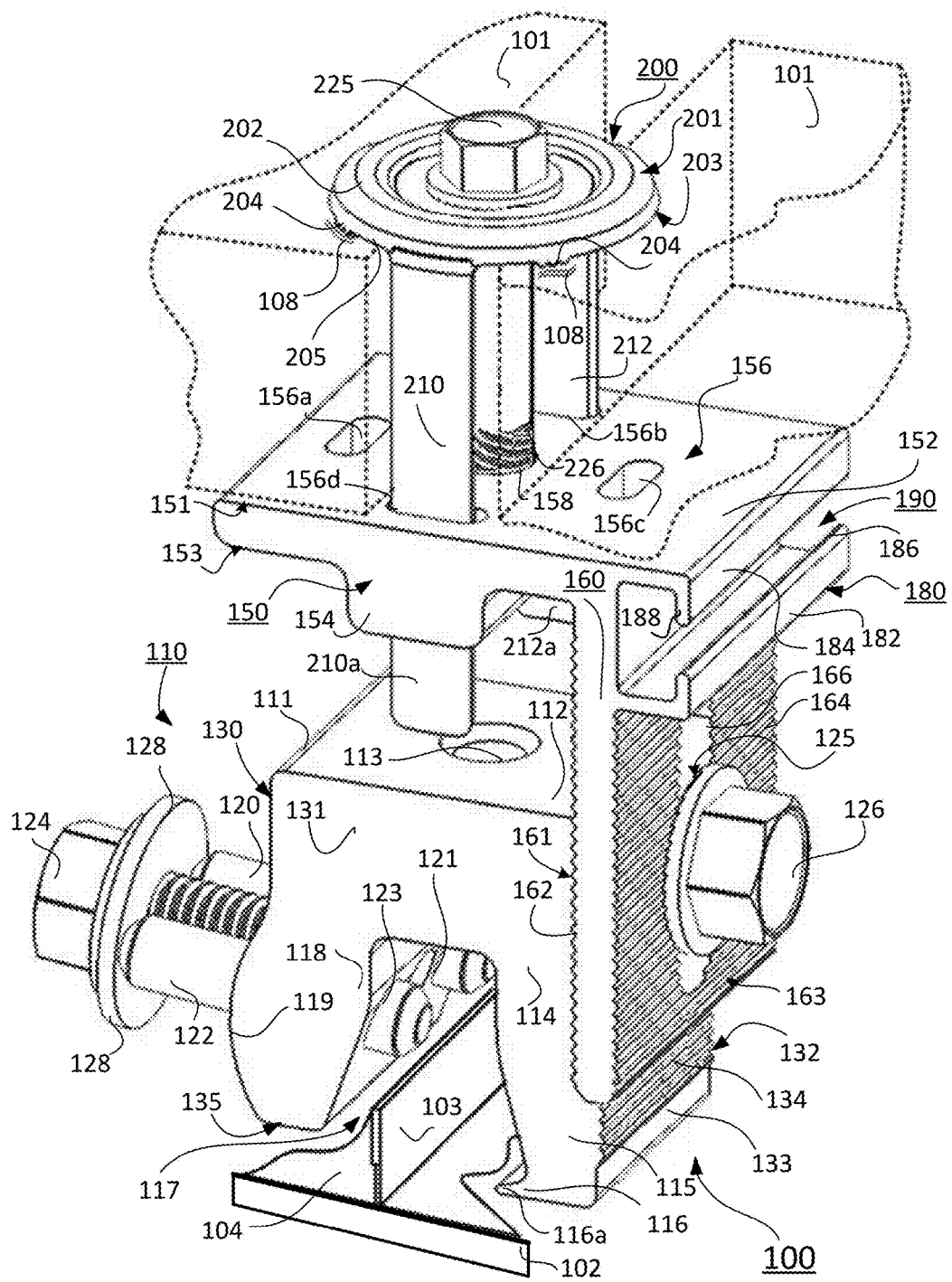
FIG. 1 is a schematic, perspective view illustrating the PV panel retention assembly, system and method in accordance with an embodiment of the present invention.

Non-limiting embodiments of the present invention will be described below with reference to the accompanying drawings, wherein like reference numerals represent like elements throughout. While the invention has been described in detail with respect to the preferred embodiments thereof, it will be appreciated that upon reading and understanding of the foregoing, certain variations to the preferred embodiments will become apparent, which variations are nonetheless within the spirit and scope of the invention.

The terms "a" or "an", as used herein, are defined as one or as more than one. The term "plurality", as used herein, is defined as two or as more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "some embodiments", "one embodiment", "certain embodiments", and "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means any of the following: "A; B; C; A and B; A and C; B and C; A, B and C". An exception to this definition will occur only when a combination of elements, functions, steps or acts are in some way inherently mutually exclusive.

The drawings featured in the figures are provided for the purposes of illustrating some embodiments of the present invention, and are not to be considered as limitation thereto. Term "means" preceding a present participle of an operation indicates a desired function for which there is one or more embodiments, i.e., one or more methods, devices, or apparatuses for achieving the desired function and that one skilled in the art could select from these or their equivalent in view of the disclosure herein and use of the term "means" is not intended to be limiting.

Figure 2:
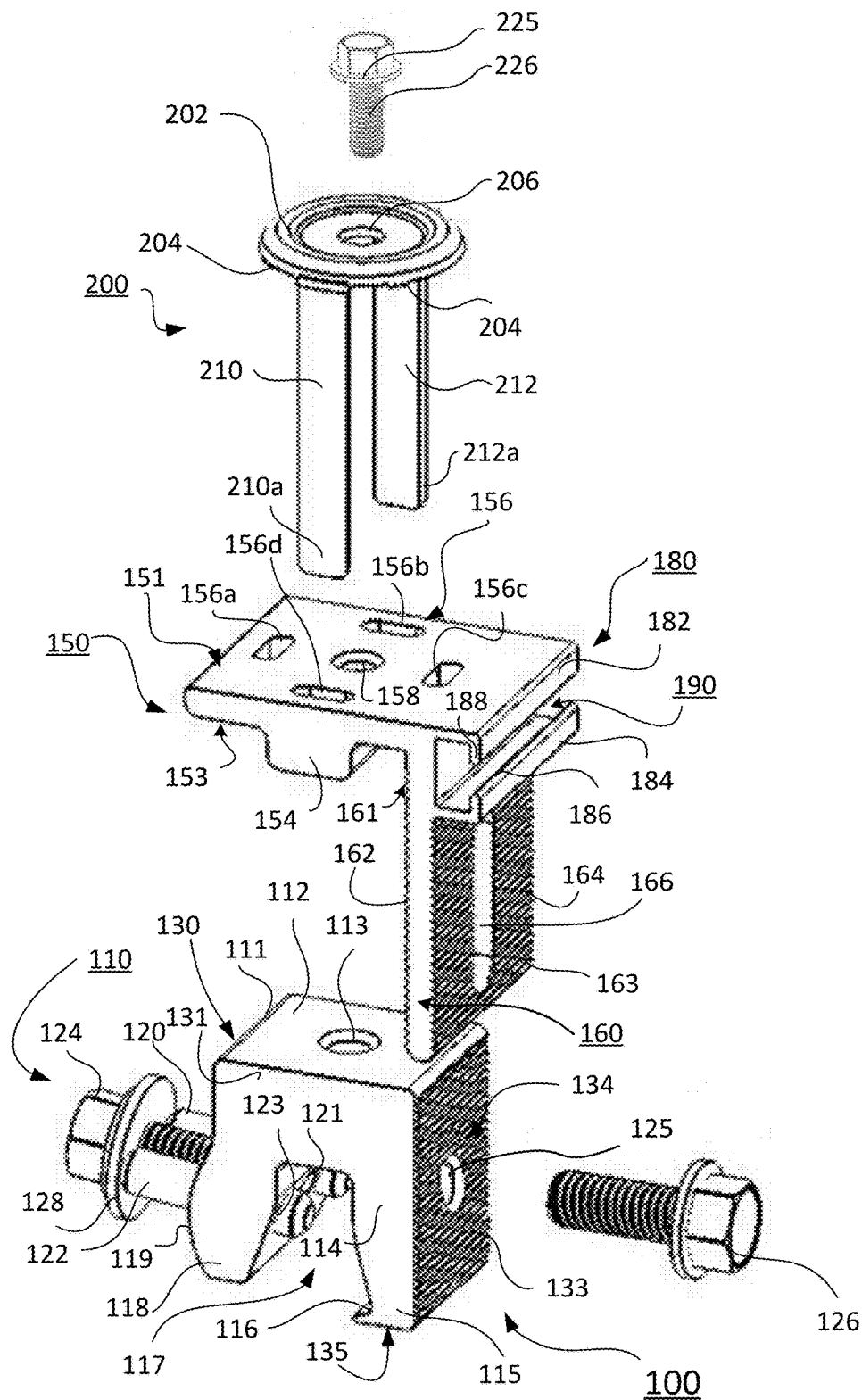
FIG. 2 is a schematic, exploded side view illustrating the PV panel retention assembly thereof.
Figure 3:
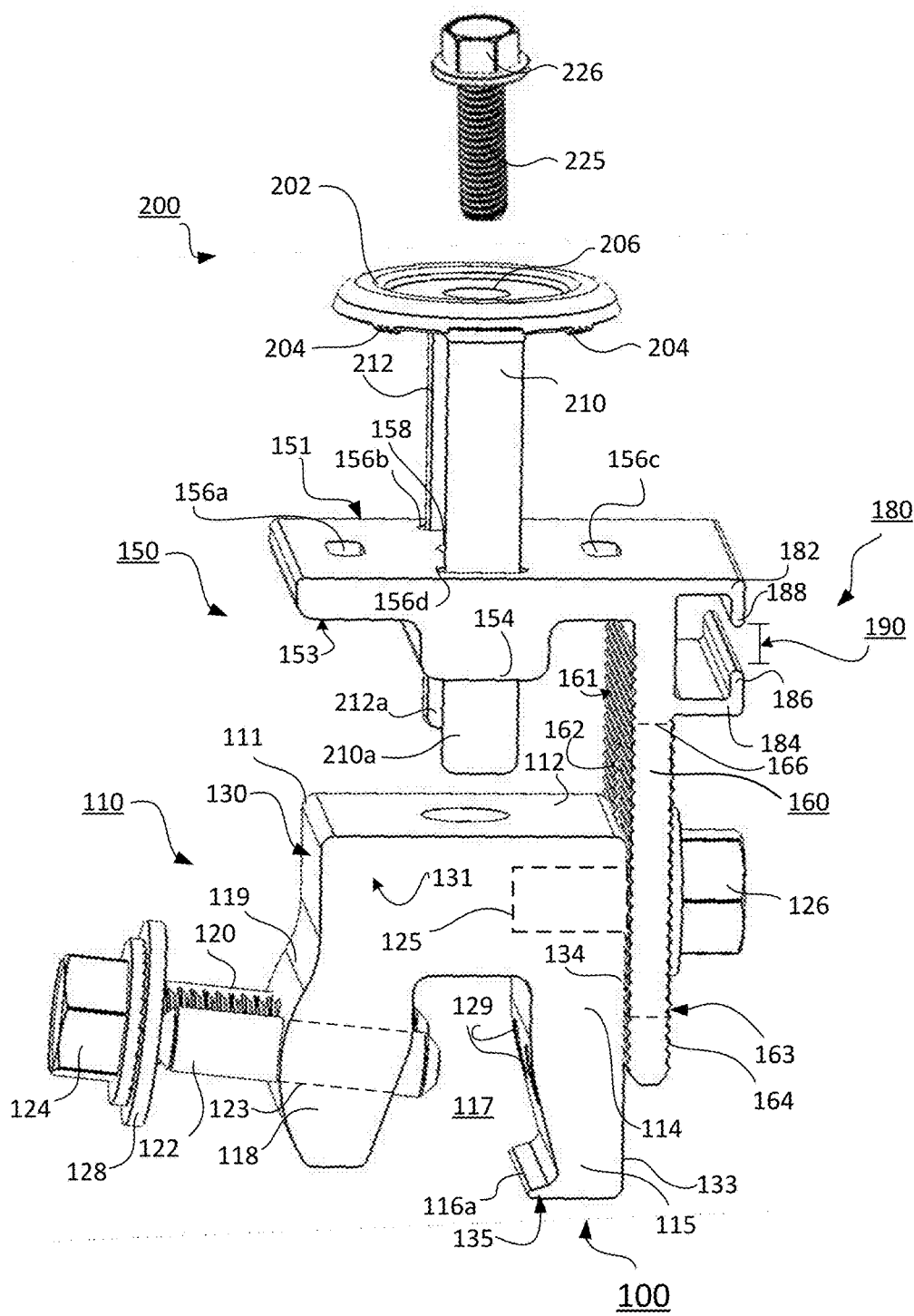
FIG. 3 is a schematic side view illustrating the aligned components PV panel retention assembly shown in of FIG. 2 combined thereof.

As is illustrated in FIGS. 1 through 7, a panel retention apparatus system and method is shown generally as element 100 and is described in an embodiment for mounting one or more photo-voltaic panels 101 to a structure 102 such as, for example, a standing seam 103 of a metal roof 104. The panel retention apparatus and system 100 is useful for mounting photo-voltaic panels 101 using a mounting clamp assembly 110, a support bracket 150 with an extension portion 160, and a solar cap 200 having flanges 210, 121 to operatively connect with the support bracket 150. The panel retention apparatus and system 100 is described in an embodiment for electrical grounding and mounting photo-voltaic panels 101 in an aligned, spaced relationship on a structure 102 (e.g. a standing seam 103 of metal roof 104, post 105, bar 106 of a rail mount 106, wall, etc.). The support bracket 150 of the panel retention apparatus and system 100 also may be used advantageously for leveling individual photo-voltaic panels 101 in a photo-voltaic (PV) panel array by making adjustments to a base platform 152 between the mounting clamp 110 and the support bracket 150 so as to create a uniform plane for the PV panel array from numerous adjacent spaced photo-voltaic panels 101 in a particular installation.

As is illustrated in FIGS. 1-4, the clamp assembly 110 comprises a body 111 that may be formed with an opening to receive the standing seam 103 such as, for example, in a generally U-shaped form. The body 111 may be formed by an extrusion manufacture and cut to suitable lengths thereby forming upper surface 112, side surfaces 130, 131, 132, and side surface 133 with clamp grooves 134, and a lower surface 135. The side surface 133 may be formed with grooves 134 so as to operatively connect to the support bracket 160 useful to adjust a base platform 162 upon which the photo-voltaic panels 101 are positioned and supported in a PV panel array so as to form a uniform plane. The body 111 may be formed from materials such as metals including aluminum, aluminum alloys, metals and metal alloys with suitable strength and resistant to environmental conditions. The body 111 is configured with an upper surface 112 having a generally planar shape with an attachment shaft 113 centrally located in the upper surface 112 for receiving a fastener (not shown) to attach items and objects thereto, or for extension of the fastener 225 such that the fastener does not bottom out on the upper surface 112. The body 111 is configured with downwardly extending legs 114 and 118 forming a slot 117 configured to receive the standing seam 102 of a metal roof 104. The leg 114 is configured with a foot 115 and a toe portion 116 at an end of the generally downwardly extending leg 114 segment thereof configured to be located adjacent the standing seam 103 and underneath any crimped ends or roll of the standing seam 103 of the metal roof 104 inserted in slot 117. The foot 115 and toe portion 116 have an increased grip used advantageously to secure to the standing seam 103 in the slot 117, whereby the applied forces are spread across the standing seam 103 through the edge 116a of the toe portion 116 so as to increase a holding force as well as to reduce puncturing (e.g. causing a hole where water and elements may enter into the structure or home through the roof) or other damage such as, for example, to a paint or hydrophobic coating (e.g. Teflon®) of the metal roof.

The leg 118 can be configured with an arcuate surface 119 formed in the side surface 130, one or more pins 120, 122 disposed in pin channels 121, 123 formed in the leg 118 of the body 111 and extending to the slot 117 along a path to one or more pockets 129 formed the inner surface of the leg 114. The one or more pockets 129 are configured to cooperate with the pins 120, 122 for increasing the holding force of the clamp assembly 110, whereby in operation, tightening fastener 124 (e.g. a serrated flange hex screw) urges the pins 120, 122 against the standing seam 103 causing an indentation or recess in the standing seam 103 by causing pressing force on the seam 103 between the end of the pins 120, 122 and the one or more pockets 129 on the leg 114. A washer 128 placed between the fastener 124 and pins 120, 122 also can be used when forcing the pins 120, 122 against the standing seam 103. A suitable claim assembly 110 is manufactured by PMC Industries, Inc. identified by clamp product part Ace Clamp®, A2® and/or A2-N™. The clamp assembly 110 of the present invention has advantages of improved holding force configured to withstand harsh environmental conditions (e.g. heat, wind, vibration, seismic, storms and other forces) so as to maintain the clamp assembly 110 secured to the standing seam 103 such as, for example, seismic, vibration, wind, hurricanes, and other adverse conditions. The clamp assembly 110 of the present invention has advantages of improved holding force load characteristics of at least a thirty percent (30%) increase compared to conventional clamp assemblies such as, for example, increased holding force ranging approximately up to and including 1,600 lb. vertical load.

Additionally, according to an embodiment of the present invention, the arcuate surface 119 formed in leg 118 may be configured to allow forming the one or more pin channels 121, 123 corresponding to pins 120, 122 at a predetermined angle 172 as illustrated in FIG. 4. The predetermined angle 172 may be established along the arcuate surface 119 of side surface 130 such as, for example, in a range between predetermined angle 172a and predetermined angle 172b. Accordingly, the clamp assembly 110 can be configured during manufacture to change, vary or modify the predetermined angle 172 of the pins 120, 122 as desired so as to change where pins 120, 122 will press against the standing seam 103. Consequently, the leg 118 of the body 111 of the clamp assembly 110 provides for customization for different pin channels and configurations of the metal roof 104 available from various metal roof manufacturers. For example, as illustrated by phantom lines 172a and 172b in FIG. 4, certain metal roof 104 have different configurations of the standing seam 102, whereby pin channels 121, 123 can be angled in the approximate predetermined angle range 172a to 172b, and the fastener 124, or fastener 124 and washer 128, of clamp assembly 110 may direct the pins 120, 122 along the predetermined angles 172a or 172b, so as to join the standing seam 103 sufficiently below the rolled metal of the seam for improved strength. Moreover, the clamp assembly 110 may be configured to direct the pins 120, 122 along the predetermined angle 172b so as to improve clearance for tools utilized by the installer, e.g. difficulty reaching and driving fasteners between standing seams 103 when certain tools are positioned horizontal and/or otherwise at angles parallel to the metal roof 104. In an alternative embodiment of the present invention, the leg 118 of the clamp assembly 110 may be formed offset pin channels 121, 123 along the arcuate surface 119, for example, a pin channel 121 formed at predetermined angle 172a and a pin channel 123 formed a predetermined angle 172b so as to offset the holding part of each pin 120, 122 whereby the washer 128 is of suitable size to urge pins 120, 122 against the standing seam 103.

As is illustrated in FIGS. 1 through 3, 6 and 7 a support bracket 150 comprises an top surface 151 forming a base platform 152 that the photo-voltaic panels 101 are positioned and mounted between the support bracket 150 and the solar cap 200, a bottom surface 153 configured with an extension portion 160 extending substantially orthogonal, or at right angles, therefrom, and a wire management portion 180 forming a channel 190 for cable, wires, and other items. The support bracket 150 may be formed from materials such as metals including stainless steel, aluminum, aluminum alloys, metals and metal alloys with suitable strength and resistant to environmental conditions.

Referring to FIGS. 1-3, 6 and 7, the base platform 152 may be formed with a plurality of openings comprising two or more flange slots 156 for example, flanged slots 156*a*, 156*b*, 156*c*, and 156*d*, and a fastener opening 158 adapted to receive and secure a fastener 225 therein. Each of the two or more flange slots 156 and the fastener opening 158 may be formed between the upper and lower surfaces 151, 153 and extending there-through. For example, the flanged portions 210, 212 may be received in the flange slots 156*b*, 156*d* by inserting the ends 210*a*, 122*a* into the flange slots on 156*b*, 156*d* extending there-through to position and secure the photo-voltaic panel(s) 101 thereon. Should be appreciated, according to another embodiment of the present invention, that the photo-voltaic panel(s) 101 may be oriented as desired, for example, orthogonal that shown in FIG. 1, that may be useful when securing the solar cap 200 to an end of a PV array of the photo-voltaic panel(s) 101 whereby the flange portions 210, 212 may be received in the flange slots 156*a*, 156*c* by inserting the ends 210*a*, 212*a* into the flange slots on 156*a*, 156*c* passing there-through. The support bracket 150 may be configured with a fastener attachment portion 154 formed on lower surface 153 adjacent the fastener opening 158 so as to provide additional material for adding strength to the fastener opening 158 as well as reducing material and material costs for the support bracket.

Referring to FIGS. 1-3, 6 and 7, the support bracket 150 may be formed having an extension portion 160 formed substantially orthogonal to the support bracket 150 extending from the bottom surface 153 so as to form a generally L-shaped structure. The extension portion 160 may have a surface, defined as a clamp surface 161, with grooves 162, for orienting adjacent the mounting clamp 110 having clamp grooves on side surface 134. Similarly, the extension portion 160 may have a surface, defined as a fastener surface 163, with grooves 164 and a slot 166 for engaging a fastener 124 oriented adjacent thereto. According to an embodiment of the present invention, the extension portion 160 may have grooves formed on one or more surfaces 161, 163 such as, for example on clamp surface 161 adjacent the side of mounting clamp 110 alone, or on both the clamp surface 161 and fastener surface 152. The mounting clamp 110 may have a grooves 134 formed on side surface 133 that operably connects with the extension portion 160 so as to provide height adjustment of the base platform 162, whereby height adjustments may be made to level long arrays of PV panels. To accomplish the adjustment, the slot 166 may be formed as an opening extending between the clamp surface 161 and the fastener surface 163 used to pass the fastener 124 there through to engage an opening 125 in the side surface 134 in the mounting clamp 110, whereby tightening the fastener 126 secures the support bracket 150 to the mounting clamp 110 with the base platform 152 at a desired height above the surface 102.

Referring to FIGS. 1-3, and 5, the retention system 100 may further include a solar cap 200 that has a generally circular body portion 202 with an upper surface 201 and lower surface 203 formed with one or more grounding projections 204 on an edge 205 of the body portion 202, and an opening 206 to receive the solar cap fastener 225 that may be configured with threads 226 for engaging the fastener opening 158 of the support bracket 150. The solar cap 200 may further include ends 210*a*, 212*a* of the flange portions 210, 212, respectively, configured to be received in two or more flange slots 156 formed in the base platform 152. For example, flange portion end 210*a* may be disposed within flanged slot 156*d*, and similarly, flange portion end 212*a* can be received in flanged slot 156*b*. The solar cap 200 may further include grounding protrusions 204 configured to engage the metal to form a frame ground connection 108 with the frame of the photo-voltaic panel 101 so as to provide electrical grounding thereof through the metal connections of the retention assembly 100 as mounted with the structure 102. The solar cap 200 may be formed from materials such as metals including stainless steel, aluminum, aluminum alloys, metals and metal alloys with suitable strength and resistant to environmental conditions.

Referring to FIGS. 1-7, the support bracket 150 may be formed also having a channel 160 configured with tabs 182, 184 with edges 186 and 188 so as to form a channel 190 for inserting objects and items such as, for example, utilized for attending to wire management, storing cables, wires, and other functions. The retention apparatus 100 may be used advantageously, eliminate the cost of expensive racking systems so as to be adaptable to various installations including e.g. bracketed and posted systems.

In operation, the photo-voltaic panel 101 may be secured to the retention apparatus, system and method 100 utilizing the clamp assembly 110 for mounting to a standing seam 103 of a metal roof 104, with the height of the photo-voltaic panel 101 is made adjustable as desired to level the photo-voltaic panel 101 by positioning the clamp grooves 162 of the extension portion 160 adjacent the grooves 134 on the mounting clamp and fastening the support bracket 150 to the mounting clamp 110 thereby operably connecting them. One or more photo-voltaic panels 101 may be positioned on the support bracket 150, oriented in a desired position, and secured thereto using the solar clamp 200. For example, the solar clamp 220 may position the ends 210*a*, 212*a* of the flanges 210, 212 in a corresponding pair of flange slots 156*d*, 156*b*, respectively, or alternatively, in a corresponding pair of flanges 156*a*, 156*d*. The fastener 225 can fasten the solar cap 220 to the support bracket 150 with the photo-voltaic panel 101 there-between. Upon fastening (e.g. tightening by turning clock-wise, or counter-clockwise as the case may be) the grounding protrusions 204 engage the frame of the photo-voltaic panel 101 to operably ground electrically the frame to the electrical ground as desired.

The retention assembly and system 100 advantageously has the compact design of with minimum of component parts that provides an efficient installation. The retention assembly and system 100 design further may be used on a variety of supports to secure to the structure 102 such as, for example, posts mounts, bracket systems, and may be used to eliminate the need for a racking system to the photo-voltaic panel 101—that has advantages as a racking system is a considerable cost in an overall installation.

While certain configurations of structures have been illustrated for the purposes of presenting the basic structures of the present invention, one of ordinary skill in the art will appreciate that other variations are possible which would still fall within the scope of the appended claims. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A retention apparatus for securing one or more photo-voltaic panels on a raised portion of a structure, the retention apparatus comprising:
   a mounting assembly comprising a mounting body having a slot formed in a bottom surface adapted to be arranged on the raised portion of the structure, said body comprising a plurality of grooves formed in a side surface;
   a support bracket comprising a base platform configured with a plurality of openings comprising two or more flange slots and a first fastener opening adapted to receive a first fastener therein and a bottom surface having an extension extending from a portion thereof, said extension configured with one or more grooves for operably connecting to said plurality of grooves formed in said mounting assembly and a slot for engaging a second fastener to said mounting body; and
   a solar cap comprising a body and one or more flanged portions adapted to be received in at least two of said flange slots;
   whereby said first fastener is configured to operatively connect said solar cap to said support bracket having and/or said one or more photo-voltaic panels disposed therebetween, and said second fastener is configured to operatively connect said plurality of grooves on said mounting assembly and said plurality of grooves on said extension so as to adjust said base platform.

2. The retention apparatus of claim 1, wherein said solar cap comprises a plurality of teeth formed in said body spaced apart from said flanged portions and dimensioned to engage said one or more photo-voltaic panels.

3. The retention apparatus of claim 1, further comprising a wire management portion having formed in said extension portion, said wire management portion having a channel configured to provide access for items from a group consisting of cables and wires.

4. A retention apparatus for securing one or more photo-voltaic panels to a structure, the retention apparatus comprising:
   a mounting body for connecting to the structure, said mounting body having a plurality of grooves formed in a side portion;
   a support bracket comprising a base platform configured with a plurality of openings comprising one or more flange slots and a first fastener opening adapted to receive a first fastener therein and a bottom portion having an extension portion extending from said bottom portion, said extension portion configured with one or more grooves for operably connecting to said plurality of grooves formed in said mounting assembly and a slot for engaging a second fastener to said mounting body; and
   a solar cap comprising a body and one or more flanged portions adapted to be received in at least one of said flange slots, whereby said first fastener is configured to operatively connect said one or more photo-voltaic panels between said solar cap and said support bracket.

5. The retention apparatus of claim 4, wherein said solar cap comprises a plurality of teeth formed in said body spaced apart from said flanged portions and dimensioned to engage said one or more photo-voltaic panels.

6. The retention apparatus of claim 4, further comprising a wire management portion having formed in said extension portion, said wire management portion having a channel configured to provide access for items from a group consisting of cables and wires.

* * * * *